United States Patent [19]

Heitzig

[11] Patent Number: 4,612,979
[45] Date of Patent: Sep. 23, 1986

[54] APPARATUS FOR THE COOLING OF ELECTRONIC ASSEMBLIES OR COMPONENTS

[75] Inventor: Claus-Peter Heitzig, Germering, Fed. Rep. of Germany

[73] Assignee: Siemens Aktiengesellschaft, Berlin and Munich, Fed. Rep. of Germany

[21] Appl. No.: 749,353

[22] Filed: Jun. 27, 1985

[30] Foreign Application Priority Data

Aug. 31, 1984 [DE] Fed. Rep. of Germany ....... 3432105

[51] Int. Cl.[4] .............................................. H01L 23/46
[52] U.S. Cl. .................................... 165/129; 165/122; 361/383; 361/384; 62/418
[58] Field of Search .................... 165/128, 129, 104.33; 361/383, 384; 62/413, 414, 415, 418

[56] References Cited

U.S. PATENT DOCUMENTS

| | | | |
|---|---|---|---|
| 3,387,648 | 6/1968 | Ward, Jr. et al. | 361/384 |
| 3,701,928 | 10/1972 | Davis | 361/383 |
| 3,730,264 | 5/1973 | Krylow et al. | 165/128 |
| 3,874,444 | 4/1975 | Perce et al. | 165/47 |

FOREIGN PATENT DOCUMENTS

| | | | |
|---|---|---|---|
| 7122 | 1/1980 | European Pat. Off. | 361/383 |
| 0020084 | 12/1980 | European Pat. Off. | |
| 0026443 | 4/1981 | European Pat. Off. | |
| 0051024 | 5/1982 | European Pat. Off. | |
| 59410 | 9/1982 | European Pat. Off. | 361/384 |
| 1103433 | 10/1961 | Fed. Rep. of Germany | |
| 2755811 | 11/1978 | Fed. Rep. of Germany | |
| 2939088 | 4/1981 | Fed. Rep. of Germany | |
| 721935 | 3/1980 | U.S.S.R. | 361/383 |

OTHER PUBLICATIONS

Hwang et al, *IBM Technical Disclosure Bulletin*, vol. 22, No. 2, 7/1979, pp. 696, 697.

*Primary Examiner*—Albert W. Davis, Jr.
*Attorney, Agent, or Firm*—John Francis Moran

[57] ABSTRACT

For the cooling of electronic assemblies or components which are accommodated in slide-in circuits disposed one above the other in a rack, cooling air is supplied to the individual slide-in circuits from the respective underside thereof, which after having been heated by the respective slide-in issues therefrom as warm air. On the rack underside and on at least one rack side and/or on the back of the rack a channel arrangement is provided which is connected with a cooling air supply system provided on the rack underside and which is in communication with the open undersides of all slide-ins for the uptake of cooling air.

8 Claims, 2 Drawing Figures

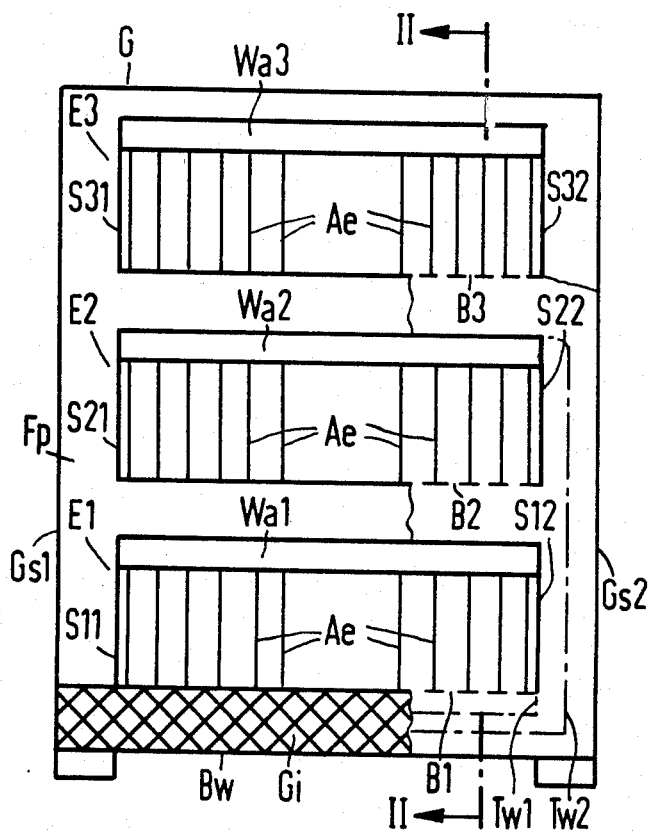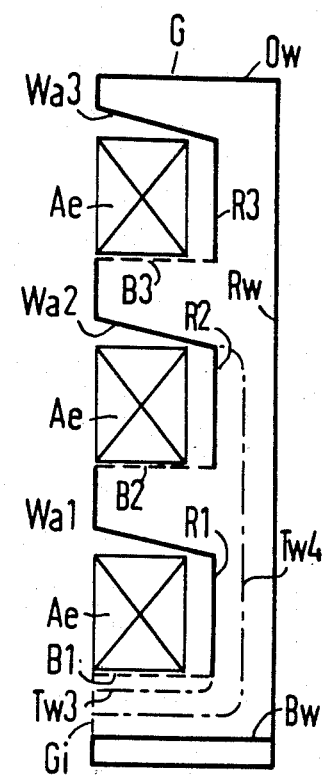

APPARATUS FOR THE COOLING OF ELECTRONIC ASSEMBLIES OR COMPONENTS

BACKGROUND OF THE INVENTION

The invention relates to apparatus for exchanging heat such as the cooling of electronic assemblies or components adapted for slide-in circuit applications arranged one above the other in racks. More particularly, it relates to apparatus which supplies cooling air to the individual slide-in circuits from their respective underside, the air leaving the respective slide-in after having been heated therein.

Conventional apparatus is known from German Pat. No. 11 03 433 which serves for the removal and deflection of the cooling air—guided through housings and cabinets of heat-generating equipment, preferably electrical equipment, from below—by means of an angled-on guide surface comprising a part or the very top covering with lateral cheeks to prevent lateral escape of cooling air. In this known device, the plate type guide surface provided for the outgoing cooling air or respectively, in the case of housings set one above the other, for the outgoing and incoming cooling air can be directed into the plane of the housing edge by its lateral cheeks pivoting about pivot pins provided near the upper housing edge. Due to this construction, with housing or slide-in compartments located one above the other, there is achieved only a cooling air flow from the respective front to the respective back through the respective housing or through the respective slide-in compartment. This means that cooling air of different temperature is available for the housings arranged at different levels, so that the cooling effect will be very different for the various housings.

Then also a cooling device referred to as a heat exchange for electronic systems, for example in U.S. Pat. No. 3,730,264, where in a rack for receiving several slide-in circuit boards (also simply called slide-ins) lying one above the other a V-shaped baffle plate is provided between pairs of slide-in rows, wherein the baffle plate is formed so that it prevents the heat escaping upward from the lower slide-in from entering the entrance zone of the slide-in thereabove, in such a way that the warm air emerging from all slide-in compartments comes out on one and the same rack side, e.g. the back. It therefore becomes a disadvantage of this conventional cooling system that the slide-ins present at different levels are supplied with cooling air of different temperature and hence are subjected to different cooling effects.

Another cooling device is disclosed in U.S. Pat. No. 3,874,474 where in a rack several slide-in compartments are stacked one above the other with separating sheets being arranged between slide-in compartments lying directly one above the other, in such a manner to provide for the removal warm air exiting from the respective lower slide-in toward the back of the rack while at the same time permitting the introduction of cold air from the front of the rack into the next higher slide-in. Thus this known device also has the deficiency that has been pointed out in connection with the other conventional device previously discussed.

Still another conventional arrangement is a multi-level encapsulated switch panel with a ventilation arrangement, see German patent document No. 27 55 811, wherein the arrangement has been subdivided into several compartments, each having a front door and containing equipment. The front door is provided with an air inlet, and the sides of the compartment are formed as a path for the outgoing air. Again it is a known disadvantage in the switching field that due to the different temperature of the cooling air the cooling effect is different for the equipment located at different levels.

It is also known to use a system for removing the heat of dissipated power from electronic equipment slide-in boards installed in a cabinet rack (DE-AS No. 29 39 088) where the respective equipment slide-ins seal off by their front panels the entire cabinet front and moreover are connected by natural convection with an air flue leading to the top side. The slide-ins to be cooled also have horizontal chassis bottoms with horizontal finned cooling units applied thereon, whose cooling channels extend from the front to the back of the cabinet and open into the flue formed on the back of the cabinet. At the front plates of these slide-ins to be cooled, air inlet openings leading to the cooling channels of these finned cooling units are provided. Again it is a disadvantage of this known system that for the cooling of the equipment slide-ins arranged at different levels of the cabinet rack cooling air of different temperature is available, owing to which the cooling effect at the different levels will again be different.

Lastly according to European patent application 0 020 084, there is disclosed an electronic rack assembly cooled via natural air convection, with at least compartments which are arranged one above the other so that they define an interspace between them. At least one air flow port opening into the interspace is provided in the top side of the lower case, and further at least one air flow port opening into the interspace is provided in the bottom side of the upper case. Finally at least one arrangement for channeling the air from the respective port in the lower case to at least one outlet opening and for channeling air from at least one inlet opening toward the respective opening in the upper case is provided. The inlet openings and the outlet openings are arranged in different areas of the front side of the interspace. The air channeling means comprises a separating means which divides the interspace into upper and lower compartments which are in flow communication with the openings of the respective upper or lower case. One of said compartments is arranged so that it is in flow communication directly with the front side of the interspace. From an opening a passage extends through said one compartment into the separating means, to connect the other compartment with the front side of the interspace. The separating means and the respective passage are arranged so that the upper compartment is in flow communication only with one or more feed openings in a lower area at the front side of the interspace and that the lower compartment is in flow communication only with one or more outlet openings above the respective inlet opening in an upper area at the said front side of said interspace. Thus also this known electronic rack has the same deficiency that has been pointed out in connection with the other conventional arrangements discussed in the foregoing.

It is, accordingly, an object of the invention to show a way how a device of the initially mentioned kind can be designed to make sure at relatively little cost that cooling air of practically the same temperature can be supplied to the slide-in compartments and associated equipment located at different levels of the rack or respectively to electronic assemblies or components, so that for all electronic assemblies or components to be cooled experience the same cooling effect.

SUMMARY OF THE INVENTION

According to the inventive principles, the problem is solved in a device of the initially mentioned kind in that on the underside of the rack and on at least one side and/or on the back of the rack, a channel configuration, is provided which is connected with a cooling air supply system provided on the underside of the rack and which communicates with the open undersides of all slide-in compartments and associated slide-in circuits for the uptake of cooling air.

The invention achieves the unique advantage that at a relatively low total cost the cooling air of practically one and the same temperature can be supplied to all slide-in compartments disposed one above the other in the rack and hence to the associated electrical assemblies or components accomodated therein. Cooling air from the lowest point of the respective rack is used, that is, from the point at which the air normally has the lowest temperature inside the space in which the respective rack is contained.

Conveniently this channel configuration serves at the same time for the uptake of cables leading to/from the slide-in printed circuit boards typically via connectors. The advantage of this is that the respective channel arrangement need not be provided separately, but that cable ducts already existing can be utilized for this.

Conveniently this channel arrangement contains a single channel. The advantage of this is an especially low cost of construction.

The channel arrangement comprises expediently of channels individually leading from the cooling air supply system to the underside of the individual slide-ins. The advantage of this is that it is possible to make available to the individual slide-ins cooling air corresponding to the respective requirements.

Preferably, however, all above-mentioned channels have equal cross-sectional areas. This brings with it the advantage of an especially low cost of construction.

Alternatively, it is also possible that the individual channels have cross-sections corresponding to the cooling air requirement in the slide-in circuits connected with them. Advantageously this measure is made use of when the individual slide-ins must remove different heat quantities.

Each slide-in comprises preferably two airtight side plates, connected together by an airtight cover plate and an airtight back plate. By this measure it is assured in an advantageous manner that cooling air can enter the respective slide-in only from its bottom.

Appropriately each slide-in has on its top side an airtight cover plate extending obliquely upward. The advantage of this is that the warm air rising in the respective slide-in can be removed from the respective slide-in in a relatively simple manner by deflection at the respective cover plate.

Preferably at least the cover plate of the respective slide-in is made of plastic. This results in the advantage that it can be assured in a particularly simple manner that the warm air issuing from a slide-in cannot contribute to an undesirable heating of the cooling air entering the slide-in thereabove. This is achieved by utilizing the poor thermal conductivity of plastics.

If necessary, at least one blower may be contained in the cooling air supply system. This measure is advantageously made use of when relatively much heat must be removed from the individual assemblies or components to be cooled.

BRIEF DESCRIPTION OF THE DRAWING

With reference to the drawings, the invention will be explained more specifically below, from this description the various advantages and additional features and objects of the invention will become apparent upon reading.

FIG. 1 shows in a schematic front view a rack where a device according to the inventive principles is employed.

FIG. 2 shows a side view along the sectional line II—II illustrated in FIG. 1.

DETAILED DESCRIPTION

In FIG. 1, a rack assembly G is shown which serves to receive three slide-in units E1, E2, E3 arranged one above the other, which in the present case are assumed to be a permanent component of rack G. Each of said slide-ins consists of two airtight side walls, an airtight bottom wall, an airtight back wall, and an airtight cover plate extending obliquely upward and forward. The side plates, cover plate and back plate of the respective slide-in are assembled, in an airtight manner. Belonging to row E1 of slide-in compartments are the side plates S11 and S12, the cover plate 1 Wal and the back plate R1 (visible in FIG. 2). Belonging to row E2 slide-in compartment in analogous manner are the side plates S21, S22 as well as the cover plate Wa2 and the back plate R2. Finally, the side plates S31 and S32 as well as the cover plate Wa3 and back plate R3 are associated with row E3 of slide-in compartments. In this manner, the various side plates and cover and back plates configure an air passage or duct with its associated row of slide-in compartments.

On the underside, the respective slide-in rows of E1, E2, E3 are formed, permeable to air. According to FIGS. 1 and 2, the undersides of the respective slide-ins E1, E2, E3 are formed by the air-permeable bottom plates B1, B2, B3 to permit the free passage of air. These bottom plates are designed so that they are suitable in the present case as supports for circuit boards containing assemblies or printed circuits to which are mounted electric assemblies or components. These assembly or component mounts, designated generally as mounting means Ae, are those arrangements which include assemblies or components to be cooled.

The rack G indicated in FIGS. 1 and 2 has, spaced from the back walls of the individual slide-ins, a closed back wall Rw, also an upper closed wall Ow, a bottom wall Bw, also closed in the present case, as well as rack side walls Gs1, Gs2 provided spaced from the side plates of the slide-ins. The front side of the rack is closed off by a front plate Fp which in the present case has openings to receive the slide-ins printed circuit boards E1, E2, E3. This front plate Fp, by the way, is connected firmly, i.e. in an airtight manner, with the side walls Gs1, Gs2 as well as with the upper wall Ow and bottom wall Bw of the respective rack G.

In the lower region, the rack shown in FIGS. 1 and 2 has a cooling air supply port serving to receive cooling air, which may be covered toward the front of rack G by a grid Gi. Cooling air entering the respective cooling air supply system is able to enter by convection through the air-permeable bottom wall B1 of slide-in E1 as well as through the air permeable bottom walls B2, B3 of the other two slide-ins E2, E3. For this the respective cooling air flows through a channel arrangement, which may be present on the rack underside and on at least one rack side and/or on the back of the rack, and which is in flow communication with the cooling air supply system. It should be noted at this point that, if desired, there may be contained in the cooling air supply system at least one blower which blows the cooling air toward the respective slide-ins.

The cooling air flowing along the individual component mounting devices Ae removes the heat from the individual warm assemblies or components and flows upward inside the respective slide-in, in order to be deflected at the respective cover plate Wa1, Wa2, Wa3 toward the front of the rack. Owing to this, warm waste air will then flow upward along the front of rack G. Accordingly, the assemblies or components contained in the various slide-ins E1, E2 and E3 always receive cooling air which has practically the same temperature for all slide-ins. In an especially simple manner this equal temperature for the respective cooling air can be obtained if at least the cover plates Wa1, Wa2, Wa3 of the individual slide-ins E1, E2, E3 are made of a plastic material which has a low thermal conductivity. But it is also readily conceivable that other plate parts of the respective slide-in consist of plastic, to reduce heat conduct to prevent the heating up of the mentioned cooling air which enters the next higher slide-in.

It has been explained in the foregoing that the cooling air entering through the grid Gi of the cooling air discharge system flows toward the air-permeable bottom wall B1, B2, B3 of the respective slide-in E1, E2 or E3. With respect to the bottom wall B1 of slide-in E1, there exists a direct flow connection from the front of rack G. With respect to the other two slide-ins E2 and E3 there is a flow connection via a channel arrangement which exists on at least one rack side and/or on the back of rack G. In principle, this channel arrangement, which can also serve to receive cables leading to/from the individual slide-ins, need be provided either only on one rack side and/or the back of the rack. The respective channel arrangement may contain a single channel which extends either on a single rack side or which extends on both rack sides and/or on the back of the rack. In this connection it should be noted, however, that is it readily possible to form the mentioned channel arrangement from several single channels which are separated from each other by partitions. Such partitions are designated by Tw1 and Tw2 in FIG. 1, and in FIG. 2 such partitions are designated by Tw3 and Tw4. These partitions are airtight; they may be arranged so that by the air channels created by them the cooling requirement in the different slide-ins is taken into account. If it is assumed that all slide-ins or the devices tp be cooled in them have the same cooling air requirement, the above-mentioned channels will have the same cross-sectional areas.

For the apparatus described according to FIGS. 1 and 2, it has been assumed that the cooling air is supplied to the individual slide-ins through the grid Gi. It should be readily plausible, however, that a corresponding or an additional cooling air supply is possible also from an air-permeable bottom wall Bw and/or from corresponding existing regions of the rack side walls Gs1, Gs2 and/or the back wall Rw at the level of grid Gi.

In conclusion, it should also be pointed out that in the form of realization of the invention described above, the back wall of the rack is formed as a closed wall. Alternatively, however, such a back wall can be dispensed with if two racks of the kind described are combined back-to-back or if one constructs them in this manner from the start.

There has thus been shown and described a novel cooling arrangement which fulfills all the objects and advantages sought therefor. Many changes, modifications, variations and other uses and applications of the subject invention will, however, become apparent to those skilled in the art after considering this specification and the accompanying drawing which disclose preferred embodiment thereof. All such changes, modifications, variations and other uses and applications which do not depart from the spirit and scope of the invention are deemed to be covered by the invention which is limited only by the claims which follow.

What is claimed is:

1. Apparatus for the cooling of electronic assemblies or components arranged in slide-in circuits located one above the other in a rack, the apparatus of the type including means for providing a cooling air supply to the individual slide-in circuits from their respective underside, the air leaving the respective slide-in circuit as warm air after having been heated therein, the apparatus comprising:

an underside and at least one side of the rack and the back of the rack configured to form a channel arrangement, the channel arrangement is connected to receive the cooling air supply communicating with a port provided on the rack underside and which is also in communication with the open undersides of all slide-in circuits for the uptake of cooling air; and the channel arrangement comprising channels individually leading from the cooling air supply to the underside of the individual slide-in circuits.

2. Apparatus for the cooling of electronic assemblies or components arranged in slide-in circuits located one above the other in a rack, the apparatus of the type including means for providing a cooling air supply to the individual slide-in circuits from their respective underside, the air leaving the respective slide-in circuit as warm air after having been heated therein, the apparatus comprising:

an underside and at least one side of the rack and the back of the rack configured to form a channel arrangement, the channel arrangement is connected to receive the cooling air supply communicating with a port provided on the rack underside and which is also in communication with the open undersides of all slide-in circuits for the uptake of cooling air;

the channel arrangement serving at the same time to receive cables leading both from and to the slide-in circuits; and the channel arrangement comprising channels individually leading from the cooling air supply to the undersides of the individual slide-in circuits.

3. Apparatus according to claim 2, wherein all channels have substantially equal cross-sectional areas.

4. Apparatus according to claim 2, wherein the individual channels have cross-sectional areas corresponding to the cooling air requirement of the slide-in circuits connected therein.

5. Apparatus according to claim 2, characterized in that each slide-in compartment has two airtight side plates which are connected together by an airtight cover plate and by an airtight back plate.

6. Apparatus according to claim 2, characterized in that each slide-in compartment has on its top side an airtight cover plate extending obliquely upward.

7. Apparatus according to claim 2, characterized in that at least the cover plate of the respective slide-in compartment comprises a plastic material.

8. Apparatus according to claim 2, further comprising at least one blower is contained in the cooling air supply system.

* * * * *